(12) United States Patent
Klemm et al.

(10) Patent No.: US 6,309,466 B1
(45) Date of Patent: Oct. 30, 2001

(54) VAPOR DEPOSITION APPARATUS

(75) Inventors: Günter Klemm, Nidda; Hans Neudert, Freigericht, both of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/506,000

(22) Filed: Feb. 17, 2000

(30) Foreign Application Priority Data

Feb. 18, 1999 (DE) .............................. 199 06 676

(51) Int. Cl.[7] .................................. C23C 16/00
(52) U.S. Cl. ........................................... 118/718
(58) Field of Search .............................. 118/718

(56) References Cited

U.S. PATENT DOCUMENTS

| | | | |
|---|---|---|---|
| 4,681,780 | 7/1987 | Kamman | 427/282 |
| 5,304,274 | 4/1994 | Crownover et al. | 156/230 |
| 5,350,598 | 9/1994 | Kleyer | 427/255.5 |
| 5,510,151 * | 4/1996 | Matsuyama et al. | 427/509 |
| 5,652,022 | 7/1997 | Achtner et al. | 427/251 |
| 6,210,487 * | 4/2001 | Mueller | 118/733 |

FOREIGN PATENT DOCUMENTS

| | | |
|---|---|---|
| 43 11 581 A1 | 12/1994 | (DE) . |
| 195 27 604 A1 | 1/1997 | (DE) . |
| 197 34 477 A1 | 2/1998 | (DE) . |
| 01 47 696 A2 | 7/1985 | (EP) . |
| 0 652 302 A1 | 5/1995 | (EP) . |

\* cited by examiner

*Primary Examiner*—Jeffrie R. Lund
(74) *Attorney, Agent, or Firm*—Smith, Gambrell & Russell, LLP

(57) ABSTRACT

A method and apparatus for vapor depositing a release agent on a foil. The foil is wrapped around a cylindrical drum which is made of a porous material. The hollow inside of the drum forms a vapor space. The outer surface of the drum includes a thin metallic layer which has engraved or etched therein a pattern of surface passages. A vaporizer vessel provides a vaporized release agent which is conducted to the vapor space inside the drum. The release agent travels through the circumferential passages so as to be deposited in a pattern on the foil which is wrapped around the drum. A conforming body covers the circumferential surface not covered by the foil and can be heated to heat the drum.

14 Claims, 1 Drawing Sheet

VAPOR DEPOSITION APPARATUS

The present invention relates to a vapor-deposition apparatus for vapor deposition of a release agent on a foil or film in a foil-coating system, which has a vaporizer vessel for heating the release agent, and a rotatably disposed, cylindrical drum which has passages on its circumferential surface for conducting the release agent vapor against the foil to be vapor-deposited, where the foil partially wraps around the drum and the drum revolves synchronously with the feed rate of the foil.

A vapor-deposition apparatus of the general type described above is referred to in DE 197 34 477. In the case of the vapor-deposition apparatus shown in FIGS. 6 to 10 of this document, a release agent nozzle connected to the vaporizer vessel is disposed in the interior of the drum immediately inside the inner circumferential surface of the drum. The conveyed release agent flows from this release agent nozzle, through the drum's area covering the release agent nozzle, and against the foil to be vapor-deposited. It is disadvantageous therein, that for the vapor-deposition of the foil, only a very short period of time is available which follows from the width of the nozzle and the feed rate of the foil or the circumferential speed of the drum. Nonetheless, in order to produce a sufficiently thick layer of release agent on the foil, the feed rate of the foil must be chosen relatively small, so that the capacity of the vapor-deposition apparatus is correspondingly small. Furthermore, the sealing of the fixed release agent nozzle with respect to the revolving drum causes difficulties and leads to wear.

An object of the present the invention is to develop a vapor-deposition apparatus of the type mentioned initially such that as high a rate as possible of vapor-deposition can be achieved.

SUMMARY OF THE INVENTION

The above and other objects of the present invention can be achieved according to the invention by the fact that the drum forms a vapor space connected to the vaporizer vessel, and the passages in the circumferential surface of the drum are covered by the wrapping area of the foil and elsewhere the circumferential surface of the drum is covered by a conforming body which runs with a slight spacing along the circumferential surface of the drum to form a narrow gap.

Because a release agent nozzle in the interior of the drum is omitted according to the invention and the drum forms a vapor space, a large area of its circumferential surface is available for the output of the release agent. The foil can thus be vapor-deposited with the release agent over the entire area of the wrapping of the drum and not only in the narrow area of the release agent nozzle as in the case of the apparatus according to DE 197 34 477. In the drum's area not wrapped by the foil, the conforming body ensures that no release agent vapor exits from the drum and contaminates the system in which the vapor-deposition apparatus is disposed. The invention makes it possible to apply a release agent to a foil in exact amounts and with good dimensional stability in order to prevent subsequent metallization in these areas. Since, according to the invention, no separate release agent nozzle is required, the requirement for a seal between such a release agent nozzle and the drum is eliminated.

The drum can be configured in very diverse ways. By way of example, it can be a metal cylinder in which the passages for the release agent vapor are configured in the form of interruptions of the circumferential surface. The drum is particularly economical to produce and permits the formation of different patterns with little expenditure if, according to an advantageous extension of the invention, the drum consists of a porous material which has a thin metallic layer on its outer side and if the passages in the drum are produced by engraving or etching of the metallic layer. In the case of such a drum, the outer metallic layer acts as a mask.

According to another embodiment of the invention, one can prevent the exit of release agent vapor via the gap between the conforming body and the circumferential surface of the drum by the fact that the conforming body has a barrier gas connection connected to the gap between the conforming body and the circumferential surface of the drum.

In order to prevent the condensation of the release agent vapor on the walls of the drum they must as a rule be heated. This can be effected in a particularly economical manner if the conforming body is heated electrically. Such heating requires little expenditure because in the case of the conforming body, in contradistinction to the drum, it is a fixed component, and as the conforming body extends up to just before the outer circumferential surface of the drum, a good transmission of heat by radiation is possible.

The heating of the drum may be effected in a quite particularly economical manner if the conforming body consists of graphite and is heated by a direct flow of current.

The drum has sufficient porosity and can, by way of example, be provided galvanically on its outer circumferential surface with a 10–100 $\mu$m-thick metallic layer of copper, nickel, or chromium, and if the drum consists of carbon reinforced with carbon fibers, can have passages forming the pattern.

If the heat should not reach through the conforming body, then, in the case of such a drum, one can provide additional heating by the drum being heated electrically by direct flow of current from one end face to the other.

An exact temperature regulation of the drum is possible by providing a pyrometer with a slight spacing from the drum.

The introduction of the release agent vapor from the fixed vaporizer vessel in the rotating drum requires little expenditure if, according to another advantageous extension of the invention, the drum, with a hollow shaft at its end, leads into a sealed bearing head connected to the vaporizer vessel.

The vaporizer vessel can have a relatively small volume for the release agent so that the vaporization rate may be changed quickly via the heater capacity if the vaporizer vessel is connected via a secondary filling line and a pressure equalization line to a release agent reservoir.

BRIEF DESCRIPTION OF THE DRAWINGS

The present invention will be further understood with reference to the accompanying drawings, wherein.

DETAILED DESCRIPTION OF THE INVENTION

The present invention will now be described in further detail.

Figure 1:
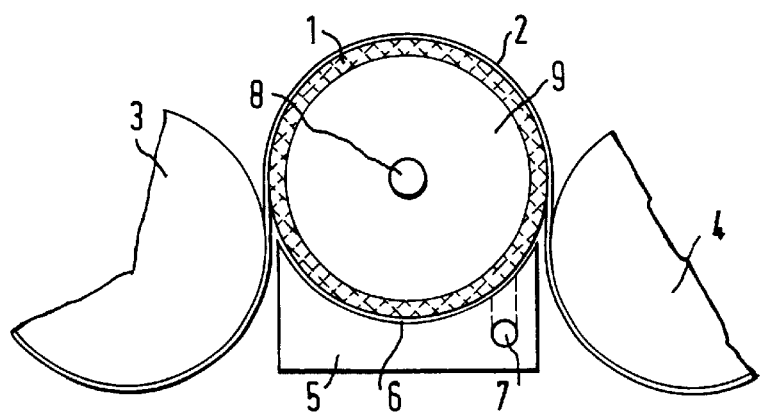
FIG. 1 is a schematic lateral view of a drum according to the invention with adjacent components.

The vapor-deposition apparatus shown in FIG. 1 has a drum 1 of porous material over which a foil 2 to be vapor-deposited is conducted. Two partially represented deflecting rollers 3 and 4, each disposed next to the drum 1, provide that the foil 2 wraps around the drum 1 over a large angle which, in the case of this embodiment example, is about 180°.

As used herein, the term "foil" includes films such as plastic film.

Below the drum 1 between the deflecting rollers 3 and 4, a graphite conforming body 5 is disposed, which extends to just before the circumferential surface of the drum 1 to form a narrow gap 6, and nearly up to both deflecting rollers 3 and 4. The conforming body 5 has a barrier gas connection 7 through which a barrier gas can be conducted into the gap 6 between the conforming body 5 and the drum 1, so that in the area of the conforming body 5, no release agent vapor may exit from the drum 1. Serving to support the drum 1 is a hollow shaft 8 through which the release agent vapor is able to arrive in the interior of the drum 1, which for this purpose is formed as a vapor space 9. The circumferential surface of the drum 1 therefore bounds the vapor space 9. The drum can be of any suitable porous material for purposes of the invention, as will be apparent to those skilled in the art. Examples are carbon reinforced with carbon fibers.

Figure 2:
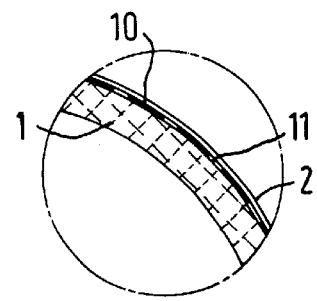
FIG. 2 is a sectional view through an area of the circumferential of the drum on a scale enlarged with respect to FIG. 1; and, FIG. 3 is a perspective view of the vaporizer apparatus according to the invention.

The enlarged sectional representation according to FIG. 2 makes it clear that, to the outer circumferential surface of the drum 1, a thin metallic layer 10 is applied which has passages 11 produced by engraving or etching and forming the pattern, through which the release agent reaches the foil 2 to be vapor-deposited.

Figure 3:
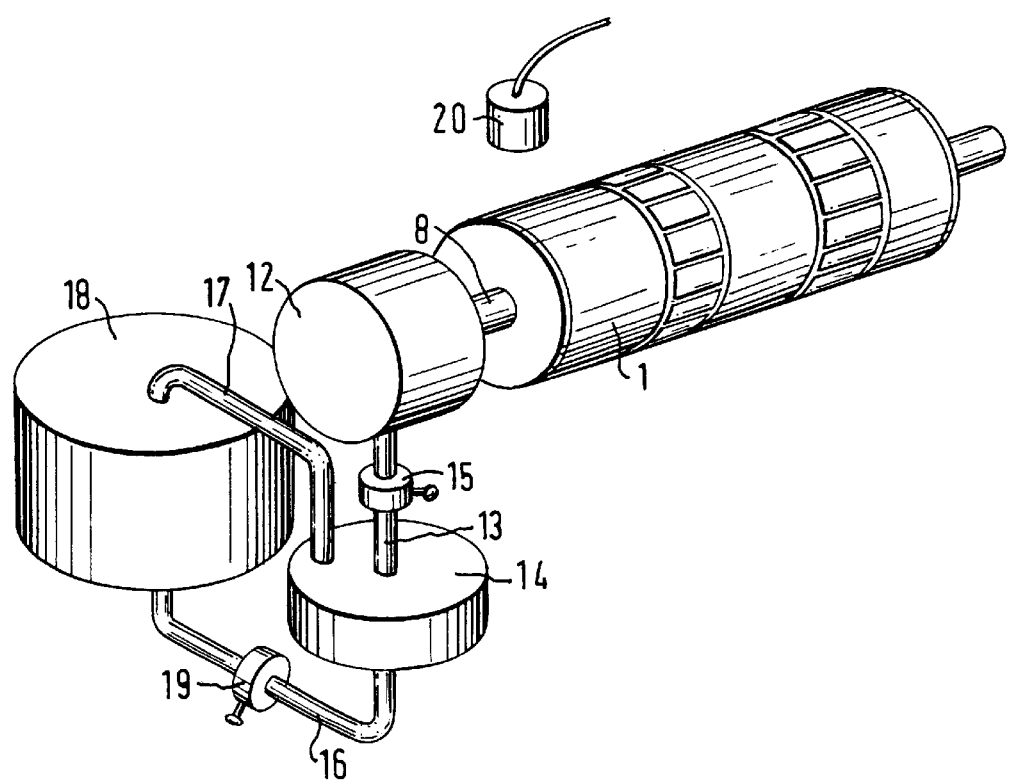

The perspective representation, according to FIG. 3, shows the drum 1 whose hollow shaft 8 leads into a bearing head 12, which is formed as a sealed chamber and is connected via a line 13 to an electrically heated vaporizer vessel 14. A check valve 15 is connected to this line 13. The vaporizer vessel 14, which is formed with a small volume, is connected via a secondary filling line 16 and a pressure equalization line 17 to a reservoir 18 for the release agent. The secondary filling line 16 has a check valve 19 through which the release agent flows into the vaporizer vessel 14 when it is in the open position.

Above the drum 1, a pyrometer 20 is to be seen which monitors the temperature of the surface of the drum 1, so that good temperature regulation is possible by means of the heating of the conforming body 5 shown in FIG. 1 and, if necessary, of the drum 1.

Further variations and modifications of the foregoing will be apparent to those skilled in the art, and are intended to be encompassed by the claims appended hereto.

German priority application DE 199 06 676 is relied on and incorporated herein by reference.

We claim:

1. An apparatus for vapor depositing a material on a foil comprising:
   a rotatably disposed drum having passages on its circumferential surface for conducting the material to be vapor-deposited;
   said foil partially wrapping around said drum and revolving synchronously therewith;
   a source of vaporized material connected to a vapor space inside said drum which is in communication with said passages;
   a conforming body extending along a portion of said circumferential surface of said drum not covered by said foil;
   wherein said vaporized material is conducted from said vapor space through said passages so as to be vapor deposited on the foil and wherein said vaporized material is prevented from being deposited by the conforming body where the foil is not present.

2. An apparatus according to claim 1, wherein said drum includes a porous material having a thin metallic layer on an outer side, said passages being formed in said metallic layer.

3. The apparatus according to claim 2, wherein said passages are formed by engraving.

4. The apparatus according to claim 2, wherein said passages are formed by etching.

5. The apparatus according to claim 1, wherein said conforming body is separated from said circumferential surface of said drum by a gap and wherein said conforming body is connected to a source of barrier gas which flows through said gap to prevent said vaporized material from exiting.

6. The apparatus according to claim 1, wherein said vaporized material is a vaporized release agent.

7. The apparatus according to claim 1, wherein said source of vaporized material is a vaporizer vessel which is heated with a heater and connected by way of a secondary filling line and a pressure equalization line to a reservoir for the material.

8. The apparatus according to claim 1, wherein the conforming body is heated electrically.

9. The apparatus according to claim 8, wherein the conforming body comprises graphite and is heated by a direct flow of current.

10. The apparatus according to claim 1, wherein said drum comprises carbon reinforced with carbon fibers.

11. The apparatus according to claim 1, wherein said drum is heated electrically by a direct flow of current from one end face to the other.

12. The apparatus according to claim 1, wherein a pyrometer is disposed at a slight distance from said drum for controlling the temperature thereof.

13. The apparatus according to claim 1, further comprising a hollow shaft connected to said drum and also connected to a sealed bearing head which is connected to said source of vaporized material.

14. The apparatus according to claim 1, further comprising rollers on either side of said drum for carrying said foil to and from said drum and arranged so that said foil travels over approximately half of the circumferential surface of said drum.

* * * * *